(12) United States Patent
Lee

(10) Patent No.: US 9,048,293 B2
(45) Date of Patent: Jun. 2, 2015

(54) SEMICONDUCTOR DEVICE AND METHOD FOR MANUFACTURING THE SAME

(71) Applicant: SK HYNIX INC., Icheon (KR)

(72) Inventor: Un Hee Lee, Icheon (KR)

(73) Assignee: SK HYNIX INC., Icheon (KR)

( * ) Notice: Subject to any disclaimer, the term of this patent is extended or adjusted under 35 U.S.C. 154(b) by 0 days.

(21) Appl. No.: 14/253,409

(22) Filed: Apr. 15, 2014

(65) Prior Publication Data

US 2014/0227851 A1    Aug. 14, 2014

Related U.S. Application Data

(62) Division of application No. 13/346,885, filed on Jan. 10, 2012, now Pat. No. 8,735,956.

(30) Foreign Application Priority Data

Jan. 26, 2011  (KR) ......................... 10-2011-0008005

(51) Int. Cl.
*H01L 21/768* (2006.01)
*H01L 27/108* (2006.01)
*H01L 49/02* (2006.01)

(52) U.S. Cl.
CPC .... *H01L 21/76831* (2013.01); *H01L 21/76829* (2013.01); *H01L 21/76837* (2013.01); *H01L 27/10814* (2013.01); *H01L 27/10808* (2013.01); *H01L 27/10855* (2013.01); *H01L 27/10885* (2013.01); *H01L 28/40* (2013.01)

(58) Field of Classification Search
CPC ............... H01L 23/5226; H01L 28/40; H01L 27/10805; H01L 23/5223; H01L 24/33; H01L 27/0629; H01L 27/10855; H01L 21/76829; H01L 21/76831; H01L 27/10808; H01L 27/10814; H01L 27/10852; H01L 27/1255
USPC ......... 257/296, 306, 307, 308, 773, 774, 775, 257/786, E23.141, E23.142, E23.144, 257/E23.145, E23.151, E23.152; 438/238, 438/239, 241, 253, 381, 396, 618, 652, 675
See application file for complete search history.

(56) References Cited

U.S. PATENT DOCUMENTS

| | | | |
|---|---|---|---|
| 6,372,575 | B1 | 4/2002 | Lee et al. |
| 6,458,692 | B1 | 10/2002 | Kim |
| 6,977,197 | B2 | 12/2005 | Park et al. |
| 2001/0045666 | A1 | 11/2001 | Kim et al. |
| 2005/0218440 | A1* | 10/2005 | Park ............................ 257/298 |
| 2006/0124979 | A1* | 6/2006 | Yun et al. ..................... 257/296 |
| 2010/0164114 | A1* | 7/2010 | Kang et al. ................... 257/773 |

FOREIGN PATENT DOCUMENTS

| | | |
|---|---|---|
| KR | 10-2001-0005108 A | 1/2001 |
| KR | 10-2001-0054400 A | 7/2001 |
| KR | 10-2002-0088980 A | 11/2002 |
| KR | 10-2005-0003636 A | 1/2005 |

* cited by examiner

Primary Examiner — Eduardo A Rodela

(57) ABSTRACT

A semiconductor device and a method for manufacturing the same are disclosed. An additional spacer is formed at a lateral surface of an upper part of the bit line so that the distance of insulation films between a storage node and a neighboring storage node contact plug is increased. Accordingly, the distance between the storage node and the neighboring storage node contact is guaranteed and a bridge failure is prevented.

10 Claims, 5 Drawing Sheets

SEMICONDUCTOR DEVICE AND METHOD FOR MANUFACTURING THE SAME

CROSS-REFERENCE TO RELATED APPLICATION

The present application is a divisional of U.S. patent application Ser. No. 13/346,885, filed on Jan. 10, 2012, which claims priority of Korean Patent Application No. 10-2011-0008005 filed on 26 Jan. 2011, which are incorporated by reference in their entirety.

BACKGROUND OF THE INVENTION

Embodiments of the present invention relate to a semiconductor device and a method for manufacturing the same, and more particularly to a semiconductor device including a storage node and a bit line and a method for manufacturing the same.

A Dynamic Random Access Memory (DRAM) includes a plurality of unit cells, each of which includes a capacitor and a transistor. The capacitor is used to temporarily store data therein. The transistor is used to transmit data between a bit line and a capacitor in correspondence with a control signal (i.e., a word line) using the electric conductivity of the semiconductor device, which changes depending on environment. The transistor has three regions including a gate, a source and a drain, where charges between the source and the drain move in response to a control signal input to the gate. The charges between the source and the drain move through a channel region in accordance with the properties and operation of the semiconductor device.

When a general transistor is formed in a semiconductor substrate, a gate is formed in the semiconductor substrate, and impurities are doped at both sides of the gate to form a source and a drain. In this case, a region between the source and the drain under the gate becomes a channel region of the transistor. The transistor, including a horizontal channel region, occupies a semiconductor substrate having a predetermined area. Reducing the overall area of a complicated semiconductor memory apparatus is difficult due to a plurality of transistors contained in the semiconductor device.

If the overall area of the semiconductor memory apparatus is reduced, the number of semiconductor memory devices capable of being acquired from each wafer is increased, resulting in increased productivity. A variety of methods have been proposed to reduce the overall area of the semiconductor memory device. For example, in one such method, a recess is formed in a substrate and a gate is formed in the recess such that a channel region is formed along a curved surface of the recess, instead of using a conventional planar gate having a horizontal channel region. With the development of the above recess gate, another method for burying the entirety of the gate in the recess to form a buried gate has also been proposed.

In the buried gate structure, a bit line contact and a storage node contact are formed by a damascene technique. Through application of the damascene technique, only an isolation film as high as a hard mask critical dimension (CD) remains between two storage node contacts. One storage node is formed between the storage node contact coupled to the storage node and the bit line hard mask. If the distance between two storage node contacts is gradually reduced as described above, a bridge failure unavoidably occurs between a storage node and a neighboring storage node contact even if there is a slight misalignment.

In a 8F2 unit cell configuration (F is a minimum pattern size of a given device structure) or larger, the distance between a storage node and a neighboring storage node contact plug is more than 1F, typically 3F. Thus, even if a storage node is formed to be slightly shifted in one direction due to misalignment, the risk that the storage node and the neighboring storage node contact plug come into contact, thus causing an electrical short, is not great.

In contrast, in a device employing a 6F2 unit cell configuration or below, the distance between a storage node and a neighboring storage node contact plug is 1F or less. Thus, even a slight misalignment may cause an electrical short between the storage node and the neighboring storage node contact plug.

BRIEF SUMMARY OF THE INVENTION

Various embodiments of the present invention are directed to providing a semiconductor device and a method for manufacturing the same that substantially obviate one or more problems due to limitations and disadvantages of the related art.

An embodiment of the present invention relates to a semiconductor device that is configured to increase the distance between insulation films of a storage node and a neighboring storage node contact by forming an asymmetrical spacer at an upper lateral surface of a bit line, resulting in a guarantee of a process margin between the storage node and the neighboring storage node contact, and a method for forming the same.

In accordance with an aspect of the present invention, a semiconductor device includes a bit line formed over a semiconductor substrate; a first spacer having a first thickness formed over a first sidewall of the bit line, and a second spacer having a second thickness formed over a second sidewall of the bit line, wherein the second thickness is greater than the first thickness; first and second storage node contact plugs formed over the first and second spacers; and first and second storage nodes coupled to the first and the second storage node contact plugs, respectively.

A third spacer having the second thickness; and a fourth spacer formed over the third spacer with a third thickness.

The bit line includes a laminated structure of a bit line conductive layer and a hard mask layer.

The first and second storage node contact plugs include a polysilicon layer.

The first and the second spacers include any of a nitride film, an oxide film, and a combination thereof, respectively.

Each of the first and the second storage nodes is formed over the bit line to partially overlap with the bit line and a neighboring bit line, respectively.

The first storage node contact plug comprises a lower contact plug and an upper contact plug, wherein the third spacer is formed over the lower contact plug and the upper contact plug, wherein the fourth spacer is formed between the third spacer and the upper contact plug.

A semiconductor device includes a bit line formed over a semiconductor substrate; first and second bit line spacers formed over first and second sidewalls of the bit line; first and second storage node contact plugs formed over the first and second spacers; and first and second storage nodes coupled to the first and the second storage node contact plugs, respectively, wherein the semiconductor device further comprises third and fourth spacers, wherein the third spacer is formed between an upper portion of the first bit line spacer and an upper portion of the first storage node contact plug, and wherein the fourth spacer is formed between an upper portion of the second bit line spacer and an upper portion of the second storage node contact plug.

The third and the fourth spacers are formed to partially overlap with the first and the second spacers, respectively, at an upper portion.

A bit line formed over a semiconductor substrate; first and second storage node contact plugs formed over first and second sidewalls of the bit line; and a first bit line spacer formed between the first sidewall of the bit line and the first storage node contact plug; and a second bit line spacer formed between the second sidewall of the bit line and the second storage node contact plug, wherein the first bit line spacer includes a first upper spacer and a first lower spacer, the first upper spacer being thicker than the first lower spacer.

The second bit line spacer includes a second upper spacer and a second lower spacer, the second upper spacer being thicker than the second lower spacer.

The first and the second storage nodes are formed in a cell array having a 6F2 unit cell configuration or less.

The first and the second storage nodes are formed of a peripheral circuitry.

In accordance with another aspect of the present invention, a method for manufacturing a semiconductor device includes forming a bit line over a semiconductor substrate; forming a first conductive pattern over a first sidewall of the bit line, the first conductive pattern including a first lower pattern and a first upper pattern; forming a second conductive pattern over a second sidewall of the bit line; forming first spacer between the first sidewall of the bit line and the first upper pattern; and forming first and second storage nodes coupled to the first and the second conductive patterns, respectively.

The second conductive pattern includes a second lower pattern and a second upper pattern, and wherein the method further comprises forming a second spacer between the second sidewall of the bit line and the second upper pattern.

Forming third spacer between the first sidewall of the bit line and the first lower pattern such that the third spacer extends between the first spacer and the first upper pattern; and forming fourth spacer between the second sidewall of the bit line and the second lower pattern such that the fourth spacer extends between the second spacer and the second upper pattern.

The first and the second storage nodes are configured to partially overlap with the bit line and a neighboring bit line, respectively.

Forming a bit line over a semiconductor substrate; forming first and second lower conductive patterns over first and second sidewalls of the bit line in such a manner that an upper portion of the first and second sidewall, respectively, of the bit line are exposed; forming a first spacer over the exposed upper portion of the first sidewall of the bit line; and forming first and second upper conductive patterns over the first and second lower conductive patterns so that the first spacer is disposed between the first upper conductive pattern and the first sidewall of the bit line.

Forming a second spacer over the exposed upper portion of the second sidewall of the bit line, wherein the second upper conductive pattern is formed over the second lower conductive pattern so that the second spacer is disposed between the second upper conductive pattern and the second sidewall of the bit line.

Forming a third spacer between the first sidewall of the bit line and the first lower conductive pattern such that the third spacer extends between the first sidewall of the bit line and the first spacer.

Forming a fourth spacer between the second sidewall of the bit line and the second lower conductive pattern such that the fourth spacer extends between the second sidewall of the bit line and the second spacer.

The first and the second lower conductive patterns are formed to have a height of 0.6~0.7 times a height the bit line, respectively.

Forming first and second storage nodes coupled to the first and the second upper conductive patterns, respectively.

The first and the second storage nodes are configured to partially overlap with the bit line and a neighboring bit line, respectively.

It is to be understood that both the foregoing general description and the following detailed description of the present invention are exemplary and explanatory and are intended to provide further explanation of the invention as claimed.

DESCRIPTION OF EMBODIMENTS

Reference will now be made in detail to embodiments of the present invention, examples of which are illustrated in the accompanying drawings. Wherever possible, the same reference numbers will be used throughout the drawings to refer to the same or like parts. A semiconductor device and a method for manufacturing the same according to embodiments of the present invention will hereinafter be described with reference to the accompanying drawings.

Figure 1:
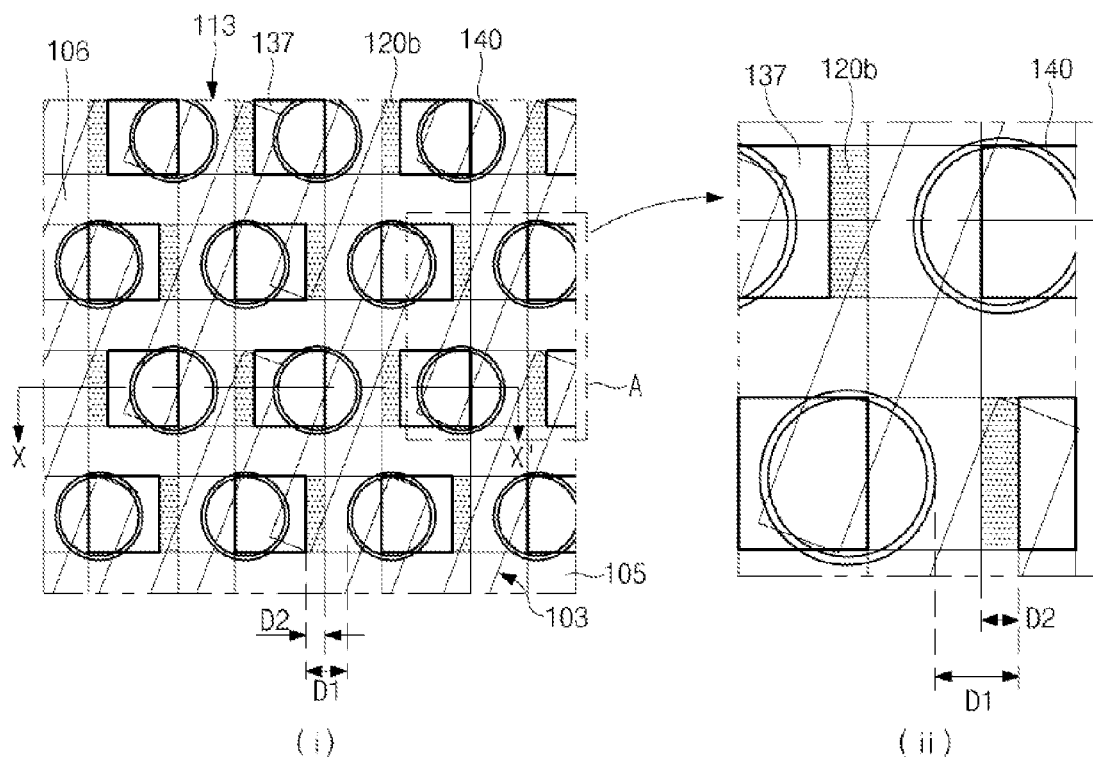
FIG. 1 is a plan view illustrating a semiconductor device according to an embodiment of the present invention.

FIG. 1 is a plan view illustrating a semiconductor device according to an embodiment of the present invention. FIG. 1 shows a cell array under a 6F2 configuration (F is a minimum pattern size in a given structural design). The present invention is especially useful for a device where the distance between a storage node and a neighboring storage node contact plug is 1F or less, such as in a 6F2 or a 4F2 unit cell configuration. However, it is also applicable for a device where the distance between a storage node and a neighboring storage node contact plug is more than 1F, such as in an 8F2 unit cell configuration. Also, the present invention is applicable to any semiconductor device insofar as it employs a storage element. Thus, the present invention is applicable, not only to a Dynamic Random Access Memory (RAM) device, but also to a Flash memory, a static RAM device, a magnetic RAM, a resistance RAM, etc.

Referring to FIG. 1(i), an active region 103 and a device isolation film 105 for defining the active region 103 are formed over the semiconductor substrate. In addition, two word lines 106 are formed to cross each active region 103. In an embodiment, each word line 106 may be formed as a buried word line in which the word line is buried in the semiconductor substrate. In addition, a line-type bit line 113 is formed to cross the word line 106. The bit line 113 is formed to pass through the center part of the active region 103.

In addition, a storage node contact plug 137 is formed at both edges of the active region 103, and a first spacer (not shown) and a second spacer 120b are formed between the storage node contact plug 137 and the bit line 113. Although FIG. 1(*i*) shows that the second spacer 120*b* is formed at only one sidewall of the bit line 113, the scope or spirit of the present invention is not limited thereto and the second spacer 120*b* may also be formed at the opposite sidewall of the bit line 113, as shown in FIG. 3B.

A storage node 140 is arranged to be coupled to the storage node contact plug 137. In order to efficiently place storage nodes 140 in a given area, the storage nodes 140 are arranged to have a uniform density, i.e., they are arranged in a symmetrical configuration. That is, the storage nodes 140 are not positioned directly above the storage node contact plugs 137, but are shifted from being directly above the storage node contact plugs 137 by a predetermined distance. As a result, the storage nodes 140 partially overlap with the bit lines 113. Preferably, the storage nodes 140 may be arranged along the direction of the bit line 113 in a zigzag manner so as to guarantee a uniform distance between neighboring storage nodes 140.

Even though FIG. 1 shows a configuration in which the storage nodes 140 are shifted by some degree, the present invention is not limited to such a configuration. The present invention is also applicable to a device in which the storage nodes 140 are arranged in an asymmetrical configuration. That is, the storage nodes 140 may be positioned directly above the storage node contact plugs 137 such that they substantially fully overlap with the storage node contact plugs 137. In that case, the storage nodes 140 do not overlap with the storage node contact plugs 137, and an overlapping area is a bit even if they are overlapping.

As shown in FIG. 1(*i*), a second spacer 120*b* is formed between the bit line 113 and the storage node contact plug 137, and increases the distance between neighboring storage node contact plugs 137. When the distance between neighboring storage node contact plugs 137 increases, the risk of an electrical short between the storage node contact plug 137 formed at a lower level and the storage node 140 formed at a higher level is reduced. That is, the misalignment tolerance in a storage node masking process for forming the storage nodes 140 increases by the thickness (D2) of the second spacer 120*b*.

If a second spacer 120*b* is not formed, the distance between a bottom edge of the storage node 140 and a neighboring storage node contact plug 137 is (D1-D2). Thus, for example, when the storage nodes 140 are formed to be shifted to the right by D1, the storage nodes 140 come into contact with the storage node contact plug 137, causing an electrical short. In contrast, when the second spacer 120*b* is present, the distance between a bottom edge of the storage node 140 and a neighboring storage node contact plug 137 is D1. Thus, even when the storage nodes 140 are formed to be shifted right by D1, the storage nodes 140 can be kept isolated from the storage node contact plug 137. As a result, a process tolerance increases, device reliability improves, and production performance improves.

FIG. 1(*ii*) is an enlarged view of a specific part (A) of FIG. 1(*i*). Referring to FIG. 1(*ii*), the second spacer 120*b* is formed between the storage node contact plug 137 and a sidewall of the bit line 113. Thus, an insulating distance D1 between the storage node 140 and the neighboring storage node contact plug 137 is increased by the thickness (D2) of the second spacer 120*b*. Typically, the distance between the storage node 140 and a neighboring storage node contact plug 137 is the width of the bit line 113.

Since, in a highly integrated structure such as 6F2 and 4F2 (F is a minimum pattern size in a given structural design), the distance (D1-D2) is considerably short, it is not easy to avoid misalignment of the storage node 140. As a result, bridge failure occurs due to an electrical short between the storage node 140 and a neighboring storage node contact plug 137. However, referring to FIG. 1(*ii*) of the present embodiment, if the distance between the storage node 140 and the neighboring storage node contact plug 137 increases by D2, the present embodiment can prevent bridge failure due to a misalignment in the process of forming the storage node 140.

It is preferred that the second spacer 120*b* is formed over an upper portion of the first spacer 116 between the bit line 113 and the storage node contact plug 137. Referring to FIGS. 2E and 3B, when the second spacer 120*b* extends down to an interface between the storage node contact plug 137 and a underlying layer of the storage node contact plug 137 (for example, the semiconductor substrate 100 either in FIGS. 2E and 32B), the contact area of the interface decreases and thus conductivity deteriorates. When the first spacer 116 is formed, the second spacer 120*b* is formed over an upper sidewall of the first spacer 116 and may not extend down to the bottom end of the first spacer 116. Therefore, the combined spacer (116+120*b*) is configured to be thicker at an upper portion than at a lower portion.

FIGS. 2A to 2E are cross-sectional views illustrating a method for manufacturing a semiconductor device according to an embodiment of the present invention. FIGS. 2A to 2E illustrate a method of fabricating the semiconductor device taken along the line X-X' of FIG. 1(*i*).

Figure 2A:
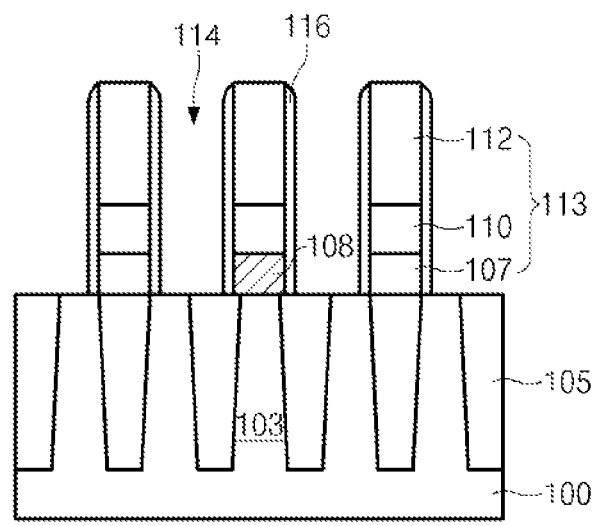
FIGS. 2A to 2E are cross-sectional views illustrating a method for manufacturing the semiconductor device according to an embodiment of the present invention.

Referring to FIG. 2A, a word line (not shown) is formed in a semiconductor substrate 100 including an active region 103 and a device isolation film 105. Although a word line formation process is not shown in FIG. 2A, it may be formed, for example, as follows. The word line (not shown) is formed as a buried gate, which is buried in the semiconductor substrate. First, a trench of a predetermined depth is formed. A gate electrode material (not shown) fills the trench to form the buried gate. However, the present invention may also be applicable to a device employing another gate structure, such as a recess gate structure, a planar gate structure, a fin gate structure, a pillar gate structure, a surrounding gate structure, etc.

A sealing layer 107 is formed over the semiconductor substrate 100 including the word line (not shown). Preferably, the sealing layer 107 may include a nitride film. Subsequently, the sealing layer 107 is selectively etched to form a bit line contact hole (not shown) exposing a source/drain region (not shown). Then, a conductive layer, for example, a polysilicon layer, fills the bit line contact hole to form a bit line contact 108. Thereafter, a bit line conductive film 110 and a bit line hard mask 112 are formed over the bit line contact 108 and the sealing layer 107.

The bit line hard mask 112, the bit line conductive film 110, and the sealing layer 107 are etched to form the bit line 113. Preferably, the bit line conductive film 110 may include tungsten (W). An interlayer insulation film (not shown) is formed over the entire surface of the semiconductor substrate 100 including the bit line 113, and the storage node contact hole 114 is formed by etching the interlayer insulation film (not shown). In an embodiment, the etch process for the storage node contact hole 114 is carried out using the bit line 113 as an etch mask. That is, the bit line 113 may be located between the storage node contact hole 114 and a neighboring storage node contact hole 114.

Thereafter, a first spacer 116 is formed at first and second sidewalls of the bit line 113. Preferably, the first spacer 116 may include any of a nitride film, an oxide film, and a combination thereof.

Figure 2B:
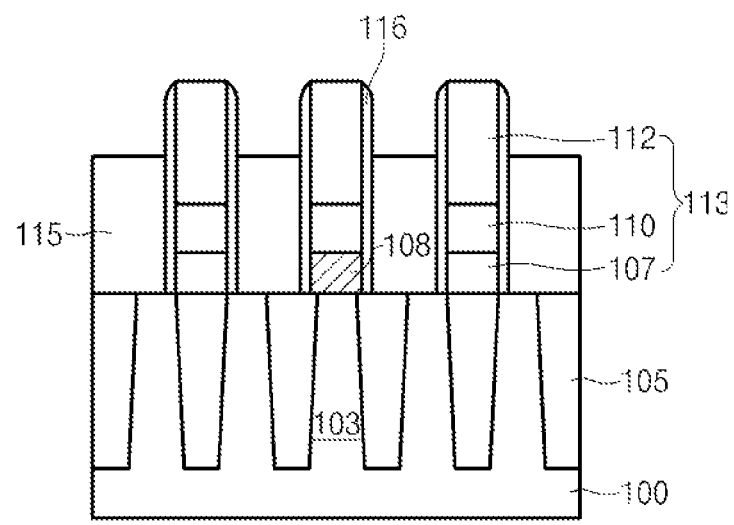

Referring to FIG. 2B, a first conductive material 115 is formed over the entire surface of the semiconductor substrate 100 including the storage node contact hole 114. In an embodiment, the first conductive material 115 is etched back so that the top part of the bit line 113 protrudes. That is, the first conductive material 115 remains only at a lower portion of the storage node contact hole 114. Preferably, an upper surface of the first conductive material 115 is formed at a higher level than a lower surface of the bit line hard mask 112. More preferably, the first conductive material 115 is formed to have a height 0.6~0.7 times the height of the bit line 113.

Figure 2C:
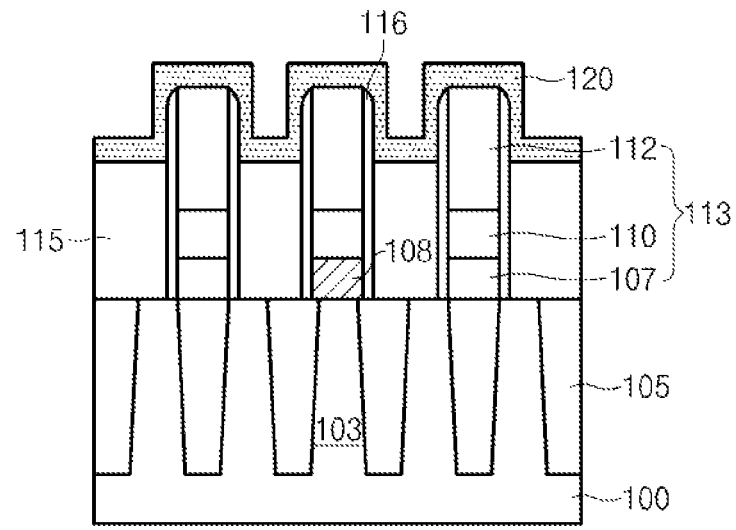

Referring to FIG. 2C, a spacer layer 120 is formed over the protruded bit line 113 and the first conductive material 115. Preferably, the spacer layer 120 may be formed to have a uniform thickness. The spacer layer 120 may include any of a nitride film, an oxide film, and a combination thereof.

Figure 2D:
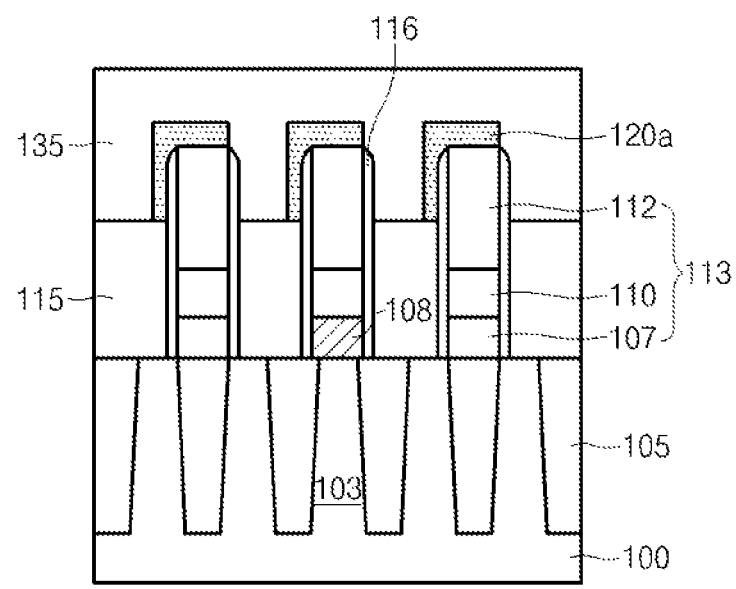
Figure 2E:
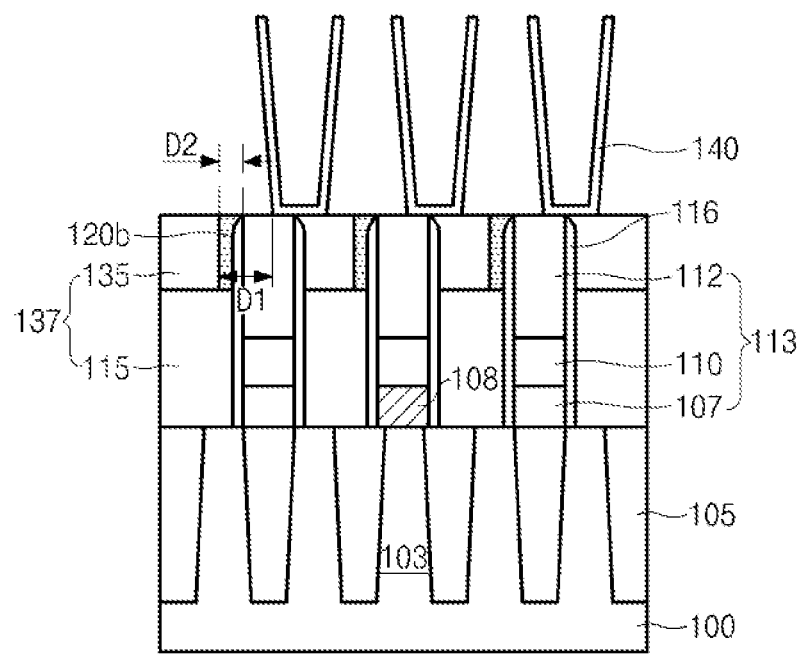

Referring to FIG. 2D, a mask pattern (not shown) is formed to cover the top part of the bit line 113 and the spacer layer 120 over the first sidewall of the bit line 113. The spacer layer 120 is etched using the mask pattern (not shown) as an etch mask, so that the spacer layer 120 located at the second sidewall of the bit line 113 is removed. Thus, a spacer pattern 120a is formed over the bit line 113 and at the first sidewall of the bit line 113. Subsequently, a second conductive material 135 is formed over the first conductive material 115 and the spacer pattern 120a. Preferably, the second conductive material 135 may be formed at a height sufficient to cover the entirety of the spacer pattern 120a formed over the bit line 113. Preferably, the second conductive material 135 may be formed of the same material as the first conductive material 115. For example, the second conductive material 135 may include polysilicon.

Referring to FIG. 2E, a planarization process is carried out until the top part of the hard mask layer 112 is exposed, such that a storage node contact plug 137 is formed. In an embodiment, the storage node contact plug 137 is formed at the same time the second spacer 120b is formed at the first sidewall of the bit line 113. Thereafter, a sacrificial film (not shown) is formed over the bit line 113 including the second spacer 120b and over the storage node contact plug 137. The sacrificial film (not shown) may be formed of a material including an oxide film. Then the sacrificial film is etched so that a sacrificial film pattern (not shown) for defining the storage node region exposing the storage node contact plug 137 is formed. Preferably, the storage node regions are not formed directly above the storage node contact plug 137.

When the storage node regions are formed directly above the storage node contact plug 137, the storage regions may have a non-uniform arrangement with respect to density and the size of the storage node regions in a highly dense area decreases. Thus, in order to increase the size of the storage node regions and thus improve device performance, the storage node regions may be formed to have a symmetrical configuration.

As a result, in the storage node region, the storage node contact plug 137 and the bit line 113 neighboring the storage node contact plug 137 are partially exposed.

Subsequently, a sacrificial film pattern is formed over the entire surface, and then patterned to form trenches to expose the storage node regions. A storage node conductive film (not shown) is formed at an inner sidewall of the trenches. The storage node conductive film is formed of titanium and patterned using a wet dip process, resulting in a separated storage node 140.

As described above, since the second spacer 120b is formed over the first sidewall of the bit line 113, the insulating distance D1 (i.e., the sum of a thickness of the first spacer 116 and a thickness of the second spacer 120b) between the storage node 140 and the neighbor storage node contact plug 137 is increased by D2, the thickness of the second spacer 120b, compared with a conventional distance (D1-D2). Thus, bridge failure between the storage node and a neighboring storage node contact plug is effectively prevented.

Figure 3A:
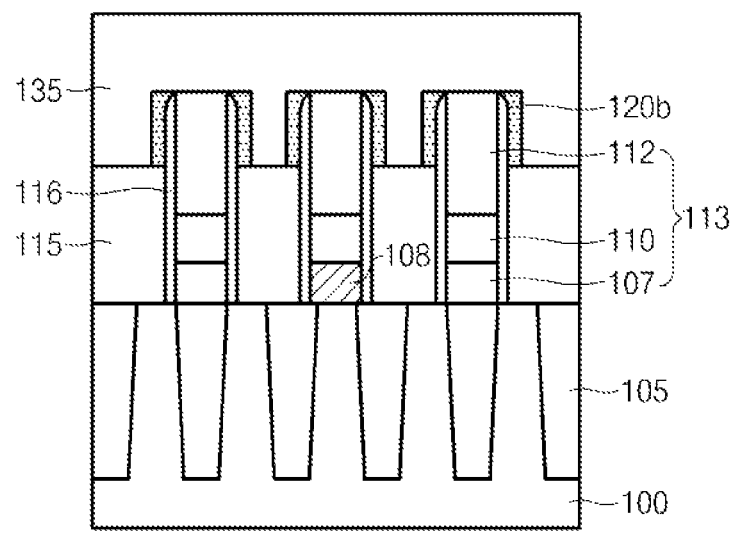
FIGS. 3A and 3B are cross-sectional views illustrating a method for manufacturing the semiconductor device according to one embodiment of the present invention.
Figure 3B:
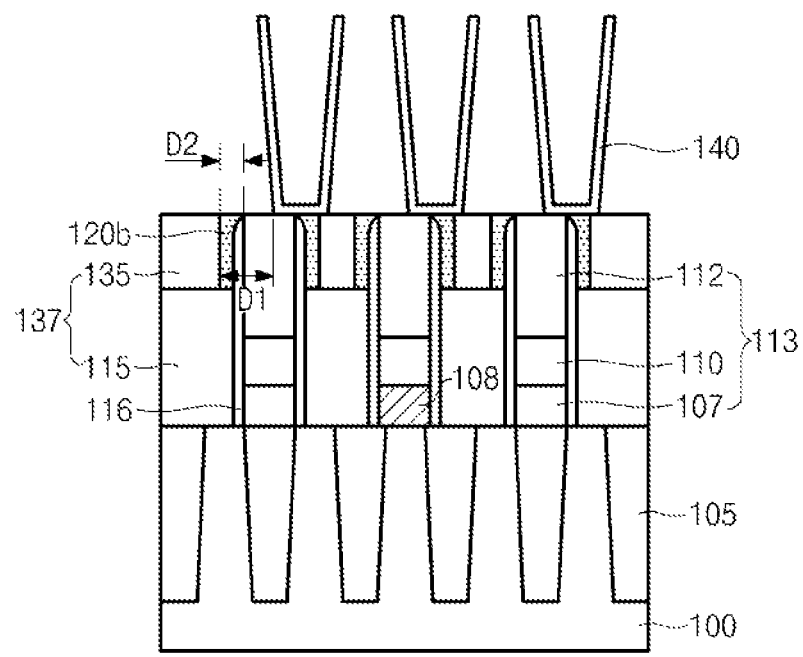

FIGS. 3A and 3B are cross-sectional views illustrating a method for manufacturing a semiconductor device according to another embodiment of the present invention. In more detail, FIGS. 3A and 3B illustrate fabrication processes subsequent to those of FIGS. 2A to 2C, and as such, a detailed description of FIGS. 2A to 2C will be omitted for convenience of description. Referring to FIG. 3A, the spacer layer 120 is etched by an etch-back process, so that the second spacer 120b is formed at both of the first and the second sidewalls of the protruded bit line 113. Preferably, the thickness of the second spacer 120b may be larger than that of the first spacer 110.

Subsequently, the second conductive material 135 is formed over the bit line 113, including the second spacer 120b, and over the first conductive material 115. Preferably, the second conductive material 135 may be formed of the same material as the first conductive material 115. More preferably, the second conductive material 135 may include polysilicon.

Referring to FIG. 3B, a planarization process is carried out until the bit line hard mask layer 112 is exposed, so that the storage node contact plug 137, including the first and second conductive materials 115 and 135, is formed. Subsequently, the storage node 140 is formed over the storage node contact plug 137. Preferably, the storage node 140 may be configured in a cylindrical form. The storage node 140 may be arranged such that it is not directly above the storage node contact plug 137, but is shifted by a predetermined distance from being directly above the storage node contact plug 137. The same process as shown in FIG. 2E can be used for forming the storage node 140, and a detailed description thereof will be omitted for convenience of description.

As described above, since the second spacer 120b is formed over both the first and the second sidewalls of the bit line 113, the insulating distance D1 between the storage node 140 and the neighboring storage node contact plug 137 is increased by D2, i.e., the thickness of the second spacer 120b. Thus, bridge failure between the storage node and the neighboring storage node contact plug is effectively prevented.

As is apparent from the above description, a semiconductor device and a method for manufacturing the same according to an embodiment of the present invention have, among others, the following advantages.

First, according to the embodiments of the present invention, the distance between a storage node and a neighboring storage node contact plug is increased, so that a misalignment tolerance during a process for forming a storage node increases.

Second, the present invention can prevent a bridge failure caused by a misalignment of a storage node and a neighboring storage node contact.

The above description of embodiments of the present invention is illustrative and not limitative. Various alternatives and equivalents are possible. The invention is not limited by the embodiments described herein. Nor is the invention limited to any specific type of semiconductor device. Other additions, subtractions, or modifications are obvious in view of the present disclosure and are intended to fall within the scope of the appended claims.

What is claimed is:

1. A method for manufacturing a semiconductor device comprising:
   forming a bit line over a semiconductor substrate;
   forming a first conductive pattern over a first sidewall of the bit line, the first conductive pattern including a first lower pattern and a first upper pattern;
   forming a second conductive pattern over a second sidewall of the bit line;
   forming a first spacer between the first sidewall of the bit line and the first upper pattern;
   forming a second spacer between the first sidewall of the bit line and the first lower pattern such that the second spacer extends between the first spacer and the first upper pattern; and
   forming first and second storage nodes coupled to the first and the second conductive patterns, respectively.

2. The method according to claim 1, wherein the second conductive pattern includes a second lower pattern and a second upper pattern, and
   wherein the method further comprises forming a third spacer between the second sidewall of the bit line and the second upper pattern.

3. The method according to claim 2, the method further comprising:
   forming a fourth spacer between the second sidewall of the bit line and the second lower pattern such that the fourth spacer extends between the second spacer and the second upper pattern.

4. The method according to claim 1,
   wherein the first and the second storage nodes are configured to partially overlap with the bit line and a neighboring bit line, respectively.

5. A method for manufacturing a semiconductor device comprising:
   forming a bit line over a semiconductor substrate;
   forming first and second lower conductive patterns over first and second sidewalls of the bit line, respectively, in such a manner that upper portions of the first and second sidewalls of the bit line are exposed;
   forming a first spacer over the exposed upper portion of the first sidewall of the bit line;
   forming a second spacer between the first sidewall of the bit line and the first lower conductive pattern such that the second spacer extends between the first sidewall of the bit line and the first spacer; and
   forming first and second upper conductive patterns over the first and second lower conductive patterns, respectively, so that the first spacer is disposed between the first upper conductive pattern and the first sidewall of the bit line.

6. The method according to claim 5, the method further comprising:
   forming a third spacer over the exposed upper portion of the second sidewall of the bit line,
   wherein the second upper conductive pattern is formed over the second lower conductive pattern so that the third spacer is disposed between the second upper conductive pattern and the second sidewall of the bit line.

7. The method according to claim 6, the method further comprising:
   forming a fourth spacer between the second sidewall of the bit line and the second lower conductive pattern such that the fourth spacer extends between the second sidewall of the bit line and the second spacer.

8. The method according to claim 6, wherein the first and the second lower conductive patterns are formed to have a height of 0.6~0.7 times a height of the bit line, respectively.

9. The method according to claim 5, the method further comprising:
   forming first and second storage nodes coupled to the first and the second upper conductive patterns, respectively.

10. The method according to claim 5, wherein the first and the second storage nodes are configured to partially overlap with the bit line and a neighboring bit line, respectively.

* * * * *